(12) United States Patent
Huang et al.

(10) Patent No.: US 7,612,433 B2
(45) Date of Patent: Nov. 3, 2009

(54) SEMICONDUCTOR DEVICE HAVING SELF-ALIGNED CONTACT

(75) Inventors: Min-San Huang, Tsinchu (TW);
Hann-Jye Hsu, Taichung County (TW);
Yung-Chung Yao, Tainan (TW)

(73) Assignee: Powerchip Semiconductor Corp., Hsinchu (TW)

( * ) Notice: Subject to any disclaimer, the term of this patent is extended or adjusted under 35 U.S.C. 154(b) by 497 days.

(21) Appl. No.: 11/162,725

(22) Filed: Sep. 21, 2005

(65) Prior Publication Data

US 2006/0183295 A1 Aug. 17, 2006

(30) Foreign Application Priority Data

Feb. 16, 2005 (TW) .............................. 94104419 A

(51) Int. Cl.
*H01L 29/06* (2006.01)
*H01L 23/58* (2006.01)
(52) U.S. Cl. ...................... 257/623; 257/638; 257/629; 257/646; 257/E21.568
(58) Field of Classification Search ................ 257/382, 257/503, 734, 758, 774, 623, 638, 629, 646, 257/E21.568; 438/407
See application file for complete search history.

(56) References Cited

U.S. PATENT DOCUMENTS

| | | | |
|---|---|---|---|
| 6,303,467 B1 * | 10/2001 | Jen et al. | 438/424 |
| 6,331,472 B1 * | 12/2001 | Liu et al. | 438/424 |
| 6,559,028 B1 * | 5/2003 | Hause et al. | 438/424 |
| 6,784,077 B1 * | 8/2004 | Lin et al. | 438/426 |
| 7,091,105 B2 * | 8/2006 | Lee | 438/424 |
| 7,229,893 B2 * | 6/2007 | Wang et al. | 438/424 |
| 2005/0040490 A1 * | 2/2005 | Park | 257/510 |

OTHER PUBLICATIONS

Article titled "Contact Size Dependence of Highly selective Self-Aligned contact Etching with Polymer Formation and its Mechanism" jointly authored by Liu et al., IEEE/SEMI Advanced Semiconductor Manufacturing conference, pp. 153-156, 2003.

* cited by examiner

*Primary Examiner*—David S Blum
(74) *Attorney, Agent, or Firm*—Jianq Chyun IP Office

(57) ABSTRACT

A method of manufacturing semiconductor devices having self-aligned contacts is provided. Multiple isolation structures are formed on the substrate to define an active area. Multiple gate structures are formed on the substrate. Multiple doped areas are formed in the substrate beside each gate structure. Multiple first spacers are formed on the sidewalls of each of the gate structure. Multiple second spacers are formed on the sidewalls of each of the isolation structure. A dielectric layer is formed on the substrate. Then, a self-aligned process is performed to form multiple contact openings in the dielectric layer between the gate structures. The conductive material is filled in the contact openings.

6 Claims, 14 Drawing Sheets

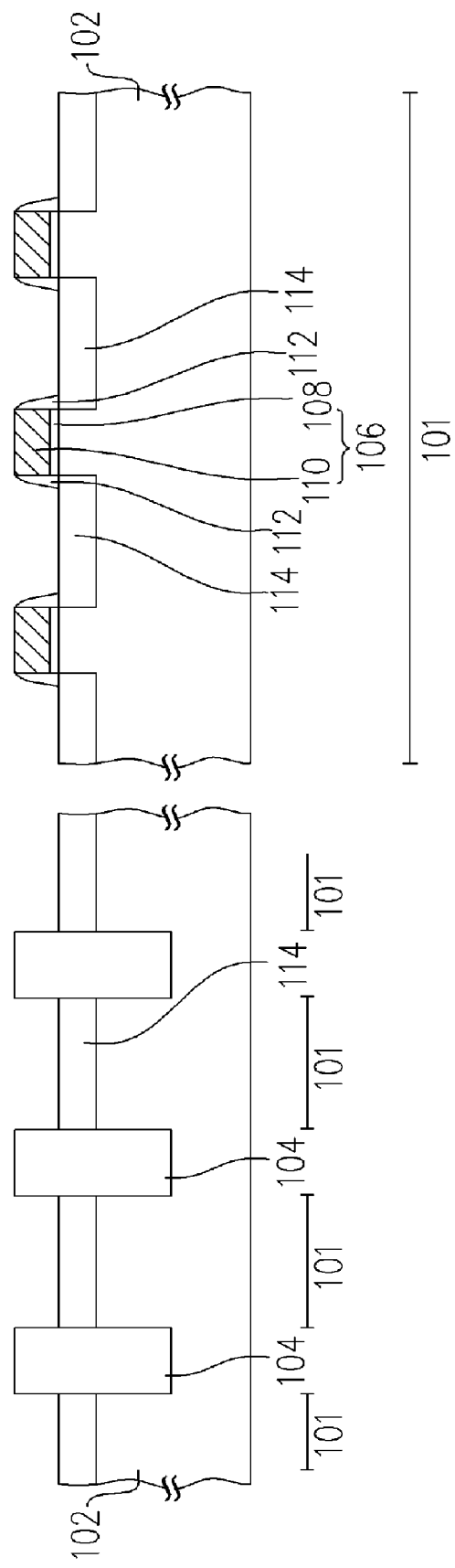

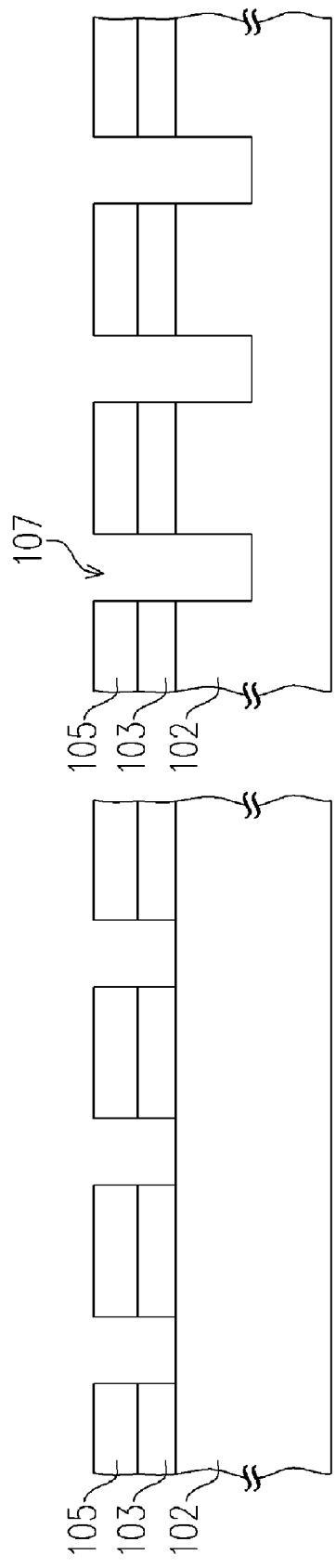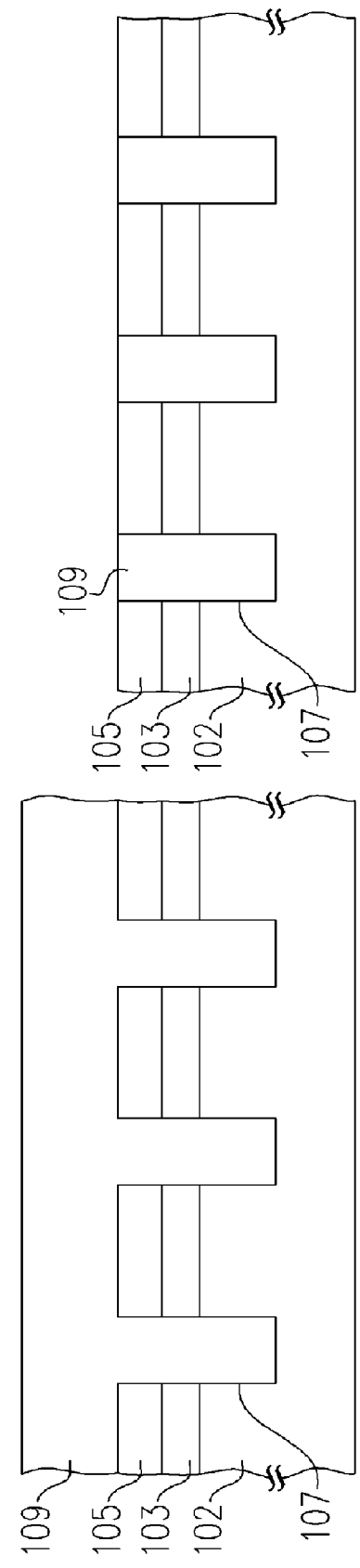
FIG. 4A (PRIOR ART)
FIG. 4B (PRIOR ART)
FIG. 4C (PRIOR ART)
FIG. 4D (PRIOR ART)

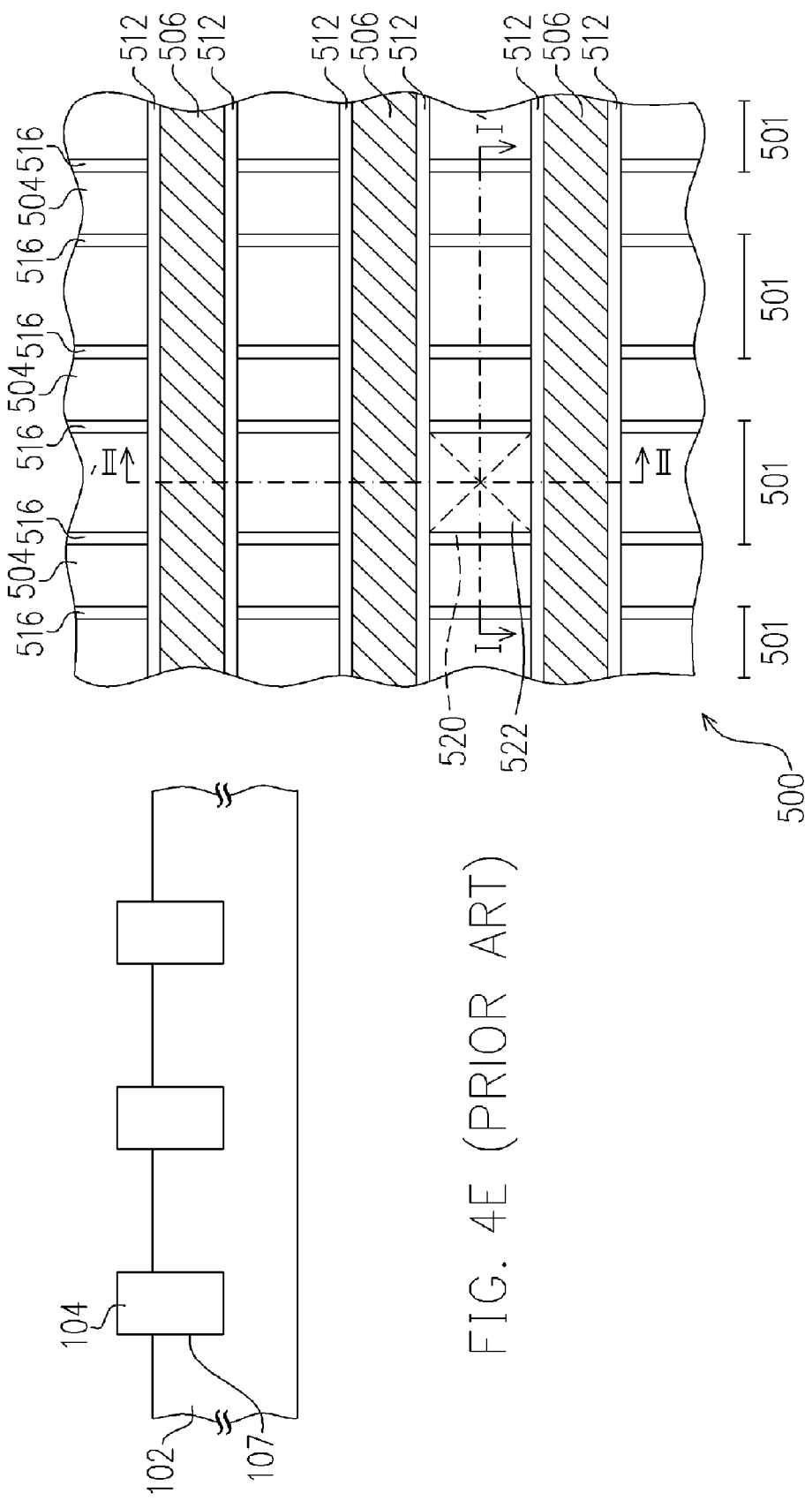

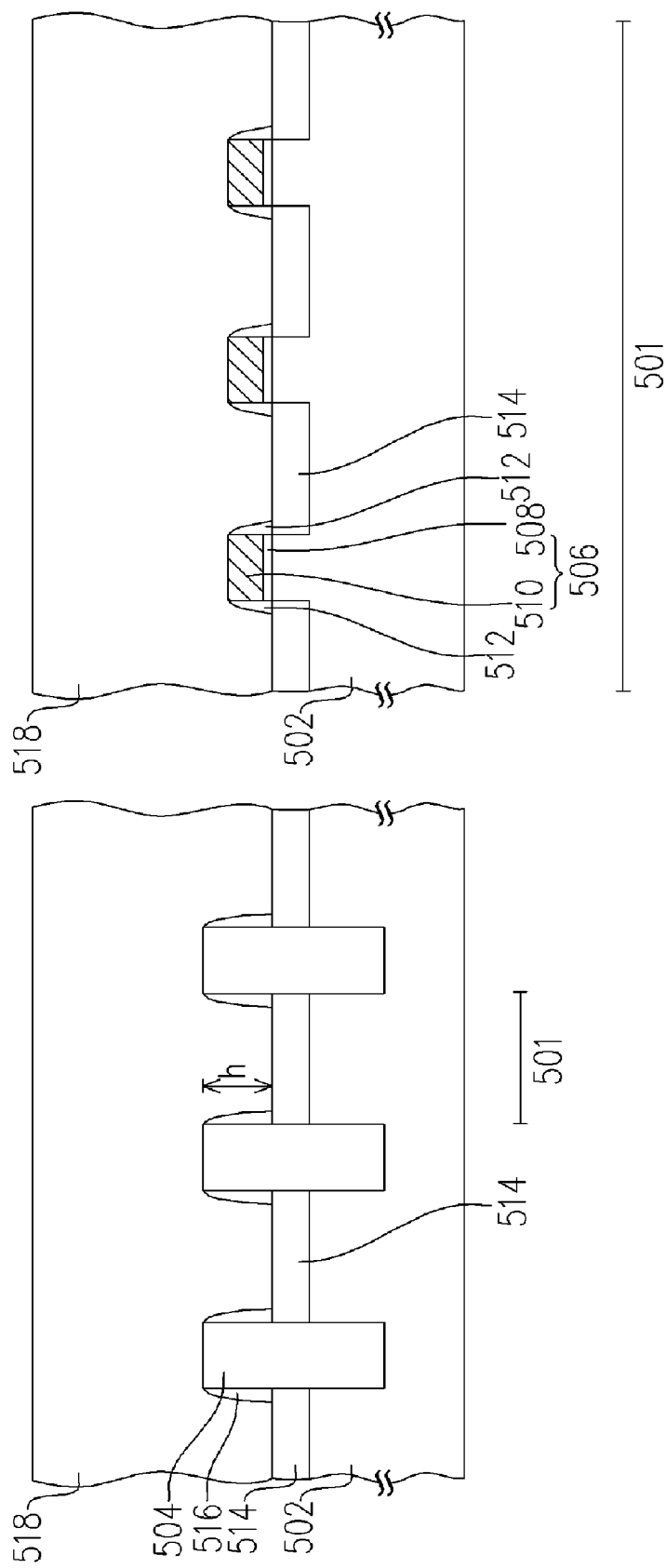

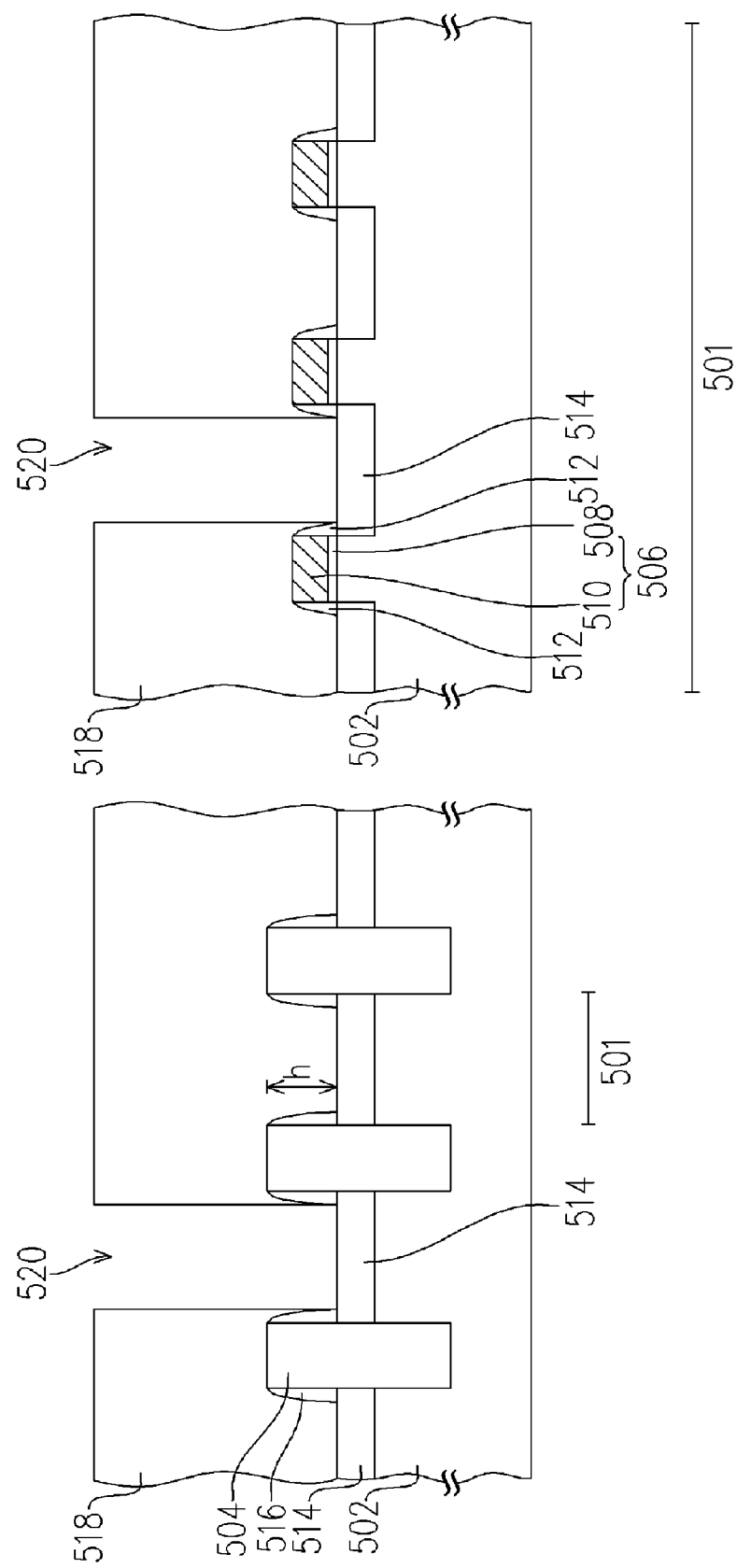

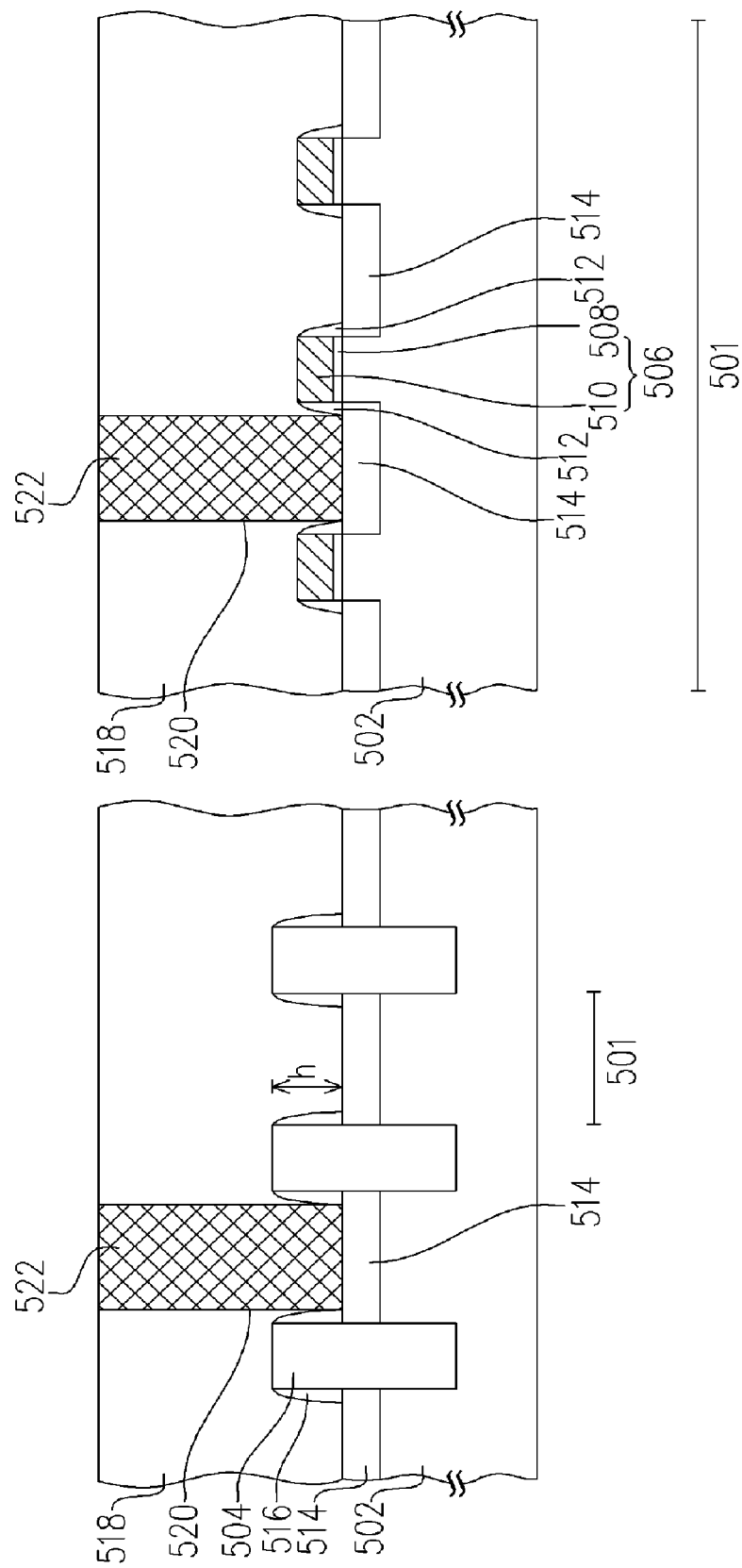

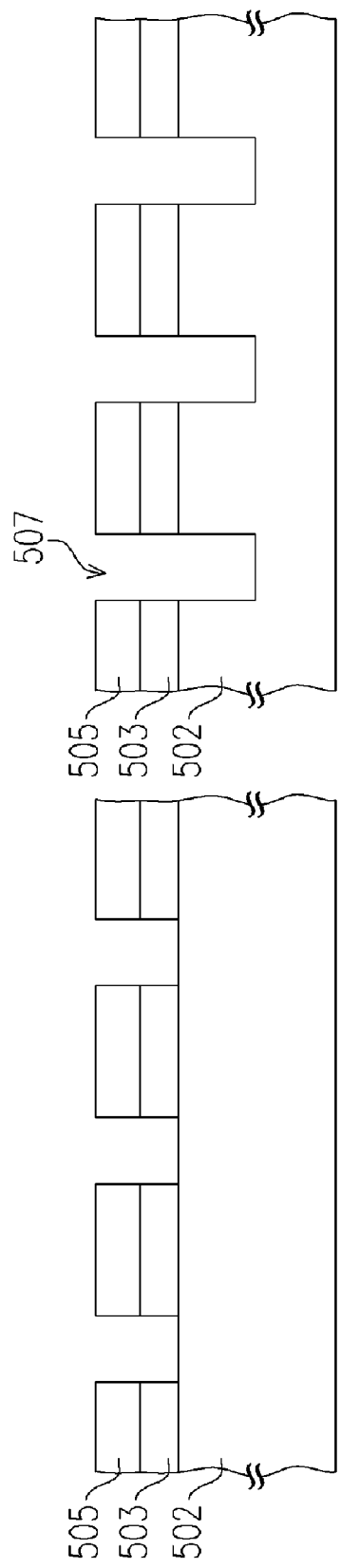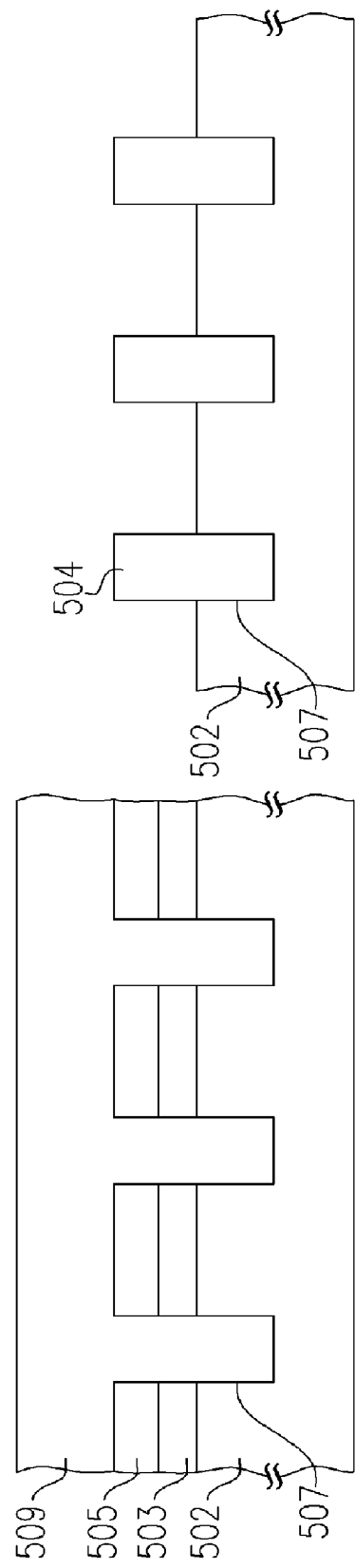

SEMICONDUCTOR DEVICE HAVING SELF-ALIGNED CONTACT

CROSS-REFERENCE TO RELATED APPLICATION

This application claims the priority benefit of Taiwan application serial no. 94104419, filed on Feb. 16, 2005. All disclosure of the Taiwan application is incorporated herein by reference.

BACKGROUND OF THE INVENTION

1. Field of the Invention

This invention generally relates to a semiconductor device and manufacturing method thereof, and especially to a semiconductor device having self-aligned contact and manufacturing method thereof.

2. Description of Related Art

Along with technical progress of semi-conductor technology, the sizes of the devices decrease gradually and enter into the deep submicron level. Recent manufacture process of ultra large integrated circuit (ULSI) has been developed to the extent of less than 0.18 micrometers. Along with increase of the integration of the integrated circuits, the contact between the metal and the semiconductor become smaller gradually. In order to overcome the gradually smaller line width and prevent the misalignment of the contacts, the design with self-aligned contact (i.e. SAC) is utilized generally.

FIG. 1 is a drawing, schematically showing a top view of a conventional semiconductor device 100 having self-aligned contacts. FIG. 2A to 2D are drawings, schematically showing cross-sectional views of a manufacturing process along the I-I line at the X direction in FIG. 1. FIG. 3A to 3D are drawings, schematically showing cross-sectional views of the manufacturing process along the II-II line at the Y direction in FIG. 1. The conventional method of manufacturing semiconductor devices having self-aligned contacts is described as below.

First, as shown in FIG. 1, FIG. 2A and FIG. 3A at the same time, multiple shallow trench isolation structures 104 are formed in the substrate 102 to define an active area 101. The manufacturing process of the shallow trench isolation structures 104 is described as below.

FIG. 4A to 4E are drawings, schematically showing cross-sectional views of a manufacturing process of the shallow trench isolation structures along the I-I line at the X direction in FIG. 1. First, as shown in FIG. 4A, a patterned under-layer 103 and a patterned mask layer 105 are formed on the substrate 102 to expose a portion of the substrate 102, wherein the total thickness of the patterned under-layer 103 and the patterned mask layer 105 is greater than 1000 angstroms. Further, as shown in FIG. 4B, with the patterned under-layer 103 and the patterned mask layer 105 as the mask, the exposed portion of the substrate 102 is removed to form multiple trenches 107 in the substrate 102. Further, as shown in FIG. 4C, a silicon oxide isolation material layer 109 is formed over the substrate 102 to cover the patterned mask layer 105 and to fully fill the trenches 107. In addition, as shown in FIG. 4D, a portion of the isolation material layer 109 outside the trenches 107 is removed. Furthermore, as shown in FIG. 4E, the patterned mask layer 105 and the patterned under-layer 103 are removed, and the isolation material layer 109 is etched by HF acid, until the thickness of the isolation material is about 300 angstroms to 400 angstroms.

Further continually as shown in FIG. 1, FIG. 2A and FIG. 3A, after the shallow trench isolation structures 104 are formed, multiple gate structures 106 are formed on the substrate 102. The gate structures 106 include the underneath disposed gate dielectric layer 108 and the upper disposed gate layer 110. Further, multiple doped areas 114 are formed in the substrate 102 at side of the each gate structure 106. Furthermore, multiple spacers 112 are formed on the sidewall of the each gate structure 106.

Further, as shown in FIG. 1, FIG. 2B and FIG. 3B, the silicon nitride layer 116 is formed on the substrate 102, for covering the substrate 102, the shallow trench isolation structures 104, each of the gate structure 106 and each of the spacers 112. Furthermore, the silicon oxide inter-layering dielectric layer 118 (ILD) is formed on the silicon nitride layer 116.

Further, as shown in FIG. 1, FIG. 2C and FIG. 3C, a self-aligned process is performed to form multiple contact openings 120 in the inter-layering dielectric layer 118 between the neighboring gate structures 106, for exposing the doped areas 114. The material of the inter-layering dielectric layer 118 is the same as the material of the shallow trench isolation structures 104. In this situation, in order to avoid damage to the shallow trench isolation structures 104 during forming the contact openings 120, the above mentioned silicon nitride layer 116 can be treated as an etching mask layer at the self-aligned process. As for the details, during forming the contact openings 120, a first etching process can be performed at the inter-layering dielectric layer 118 and the etching process can stop at the silicon nitride layer 116. Further, a cleaning process is performed. Even furthermore, another etching process can be performed at the silicon nitride layer 116 again to accomplish the manufacture of the contact openings 120.

Further, as shown in FIG. 1, FIG. 2D and FIG. 3D, a conductive material is filled in each of the contact opening 120. Furthermore, the superabundant conductive material is removed for forming the plug structures 122, and a semiconductor device having self-aligned contacts 100 is accomplished.

It should be noted that although the damage to the shallow trench isolation structures can be avoided by forming the silicon nitride at the self-aligned process, the necessary integration of the device itself must be sacrificed in order to form the silicon nitride layer. Furthermore, when the distance between the neighboring shallow trench isolation structures becomes smaller and smaller, the holes may be formed between the shallow trench isolation structures at forming the silicon nitride layer. Therefore, even though the manufacture process technology can achieve a success to a further smaller line width, the relative large preserved space in advance between the shallow trench isolation structures is still necessary, in order to prevent the holes from being caused. As a result, the improvement of the integration of the device is affected.

SUMMARY OF THE INVENTION

An object of the present invention is to provide a semiconductor device having self-aligned contact and manufacturing method thereof, which not only can avoid the misalignment of the contact openings but also can improve the integration of the device.

The present invention provides a method of manufacturing semiconductor devices having self-aligned contacts. First, multiple isolation structures are formed on the substrate to define an active area. The top of each of the isolation structures keeps a distance with the surface of the substrate. Further, multiple gate structures are formed on the substrate. Multiple doped areas are formed in the substrate at each side of the gate structure. Multiple first spacers are formed on the sidewall of each gate structure. Multiple second spacers are formed on the sidewall of each of the isolation structures. A dielectric layer is formed on the substrate, for covering the substrate, the gate structures, the isolation structures, the first spacers and the second spacers. Then, a self-aligned process is performed to form multiple contact openings in the dielectric layer between the two neighboring gate structures for exposing the doped areas. A conductive material is filled in the contact openings.

In accordance with the method of manufacturing semiconductor devices having self-aligned contacts in the preferred embodiments of the present invention, the distance between the top of each of the isolation structures and the surface of the substrate is, for example, at least 1000 angstroms.

In accordance with the method of manufacturing semiconductor devices having self-aligned contacts in the preferred embodiments of the present invention, the method of forming the isolation structures on the substrate includes, for example, forming a patterned under-layer and a patterned mask layer over the substrate and to expose a portion of the substrate. Further, with the patterned under-layer and the patterned mask layer as a mask, a portion of the exposed substrate is removed to form multiple trenches in the substrate. Further, an isolation material layer is formed on the substrate to cover the patterned mask layer and to fully fill the trenches. After then, a portion of the isolation material layer outside the trenches is removed. Furthermore, the patterned mask layer and the patterned under-layer.

In accordance with the method of manufacturing semiconductor devices having self-aligned contacts in the preferred embodiments of the present invention, the first spacers and the second spacers can be formed at the same step or different steps.

In accordance with the method of manufacturing semiconductor devices having self-aligned contacts in the preferred embodiments of the present invention, the material of the first spacers and the second spacers is, for example, silicon nitride.

In accordance with the method of manufacturing semiconductor devices having self-aligned contacts in the preferred embodiments of the present invention, the material of the dielectric layer can be silicon oxide such as BPSG (borophosphosilicate glass) or TEOS (tetra-ethyl-ortho-silicate).

In accordance with the method of manufacturing semiconductor devices having self-aligned contacts in the preferred embodiments of the present invention, the method of forming the gate structures includes, for example, forming a gate dielectric layer over the substrate first, further forming a gate layer over the gate dielectric layer, and furthermore patterning the gate layer and the gate dielectric layer.

The present invention provides a semiconductor device having self-aligned contacts, which includes multiple isolation structures, multiple gate structures, multiple doped areas, a dielectric layer, multiple conductive plugs, multiple first spacers and multiple second spacers. The isolation structures are disposed on the substrate to define an active area, wherein the top of each isolation structure keeps a distance with the surface of the substrate. The gate structures are disposed over the substrate, the doped areas are disposed in the substrate beside each of the gate structures, the dielectric layer covers the substrate, above mentioned the gate structures and the isolation structures, the conductive plugs are disposed in the dielectric layer and are electrically connected with the doped areas, the first spacers are disposed on the sidewall of each of the gate structures and are between the conductive plugs and the gate structures. The second spacers are disposed on the sidewall of each of the isolation structures and are between the conductive plug and the isolation structure.

In accordance with the semiconductor device having self-aligned contacts in the preferred embodiments of the present invention, the distance between the top of each of the isolation structures and the surface of the substrate is, for example, at least 1000 angstroms.

In accordance with the structure of the semiconductor device having self-aligned contacts in the preferred embodiments of the present invention, the material of the first spacers and the second spacers is, for example, silicon nitride.

In accordance with the semiconductor device having self-aligned contacts in the preferred embodiments of the present invention, the material of the isolation layer can be silicon oxide such as BPSG or TEOS.

Owing to that the spacers are formed on the sidewalls of the isolation structures and the gate structures in the present invention, when the self-aligned process is performed, the misalignment can be effectively avoided so that the damage to the isolation structures and the gate structures can be effectively prevented from occurring. Besides, instead of the conventional silicon nitride serving as the etching mask layer, the spacers are formed on the sidewalls of the isolation structures in the present invention, so that the manufacture process is simpler and the integration of the devices is increased.

The above is a brief description of some deficiencies in the prior art and advantages of the present invention. Other features, advantages and embodiments of the invention will be apparent to those skilled in the art from the following descriptions, accompanying drawings and appended claims.

BRIEF DESCRIPTION OF THE DRAWINGS

FIGS. 2A to 2D are drawings, schematically showing cross-sectional views of a manufacturing process along the I-I line at the X direction in FIG. 1.

FIGS. 3A to 3D are drawings, schematically showing cross-sectional views of the manufacturing process along the II-II line at the Y direction in FIG. 1.

FIGS. 4A to 4E are drawings, schematically showing cross-sectional views of a manufacturing process of shallow trench isolation structures along the I-I line at the X direction in FIG. 1.

FIG. 5A is a drawing, schematically showing a top view of semiconductor devices having self-aligned contacts according to an embodiment of the present invention.

FIGS. 6A to 6E are drawings, schematically showing cross-sectional views of the manufacturing process along the I-I line at the X direction in FIG. 5A.

FIGS. 7A to 7E are drawings, schematically showing cross-sectional views of the manufacturing process along the II-II line at the Y direction in FIG. 5A.

FIGS. 8A to 8D are drawings, schematically showing cross-sectional views of the manufacturing process of the isolation structures along the I-I line at the X direction in FIG. 5A.

DESCRIPTION OF THE PREFERRED EMBODIMENTS

Figures 5B, 5C:
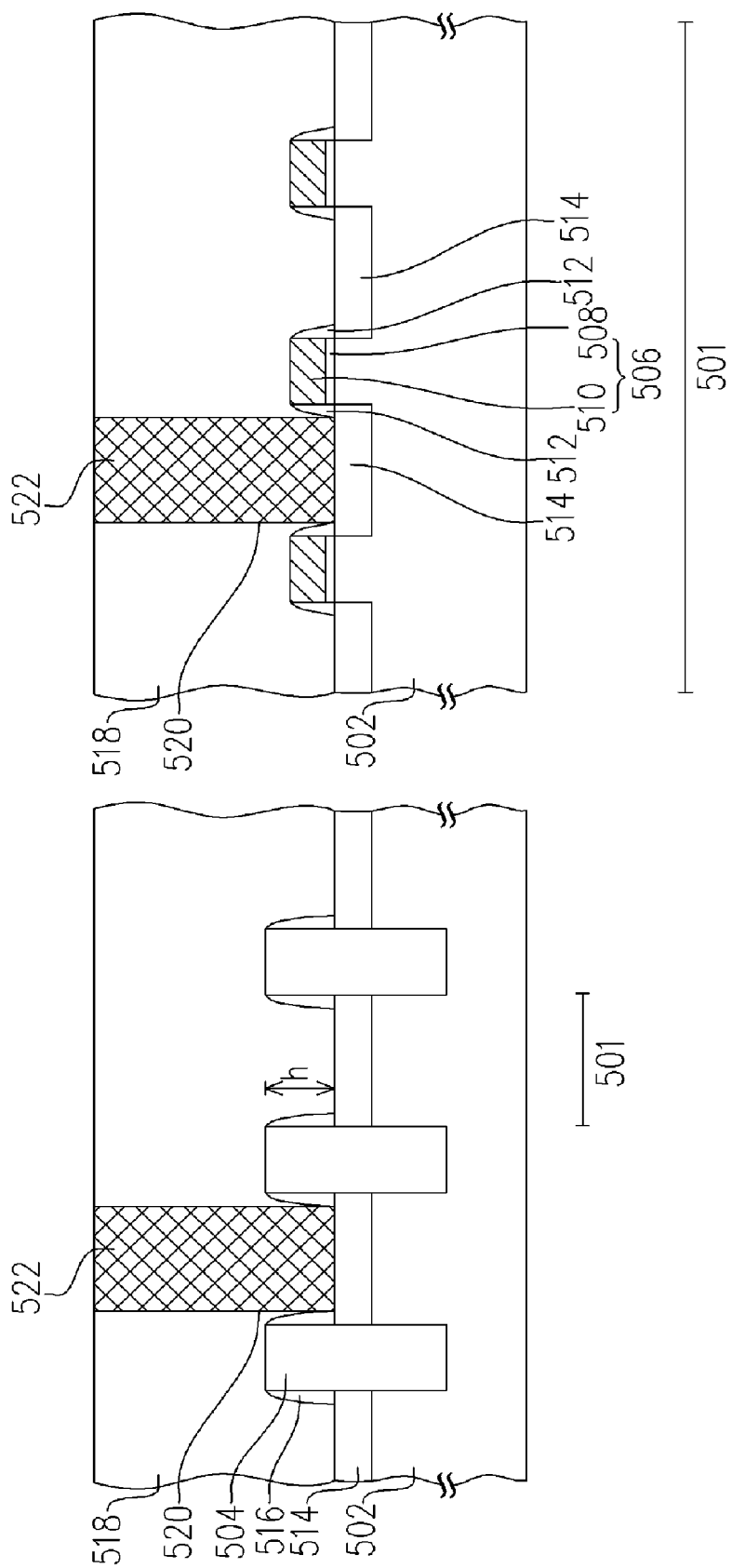
FIG. 5B is a drawing, schematically showing a cross-sectional view of the semiconductor devices having self-aligned contacts along the I-I line at the X direction in FIG. 5A.
FIG. 5C is a drawing, schematically showing a cross-sectional view of the semiconductor devices having self-aligned contacts along the II-II line at the Y direction in FIG. 5A.

FIG. 5A is a drawing, schematically showing a top view of semiconductor devices having self-aligned contacts according to an embodiment of the present invention. FIG. 5B is a drawing, schematically showing a cross-sectional view of the semiconductor devices having self-aligned contacts along the I-I line at the X direction in FIG. 5A. FIG. 5C is a drawing, schematically showing a cross-sectional view of the semiconductor devices having self-aligned contacts along the II-II line at the Y direction in FIG. 5A.

As shown in FIG. 5A, FIG. 5B and FIG. 5C at the same time, the semiconductor devices 500 having self-aligned contacts include multiple isolation structures 504, multiple gate structures 506, multiple doped areas 514, a dielectric layer 518, multiple conductive inserting plugs 522, and multiple spacers 512 and 516.

The isolation structures 504 are disposed on the substrate 502 to define an active area 501, wherein the tops of the isolation structures 504 keep a distance h from the surface of the substrate 502. The distance h in the embodiment of the present invention is, for example, at least 1000 angstroms. The gate structures 506 are disposed on the substrate 502. The gate structures 506 include the underneath disposed gate dielectric layer 508 and the upper disposed gate layer 510. The material of the gate dielectric layer 508 is, for example, silicon oxide or other suitable materials, and the material of the gate layer 510 is, for example, metal or polycrystalline silicon.

The doped areas 514 are disposed in the substrate 502 beside each gate structure 506, the dielectric layer 518 covers the substrate 502, above mentioned the isolation structures 504 and the gate structures 506, wherein the material of the dielectric layer 518 can be silicon oxide, such as BPSG or TEOS silicon oxide.

The conductive plugs 522 are disposed in the dielectric layer 518 and are electrically connected with the doped areas 514, wherein the material of the conductive plugs 522 is, for example, metal. The spacers 512 are disposed on the sidewall of each of the gate structure 506 between each of the conductive plugs 522 and each of the gate structures 506, wherein the material of the spacers 512 is, for example, silicon nitride. The spacers 516 are disposed on the sidewalls of each isolation structure 504 and between each of the conductive plugs 522 and each of the isolation structures 504, wherein the material of the spacers 516 is, for example, silicon nitride.

The following is a description of the manufacture method of the above mentioned structures. FIGS. 6A to 6E are drawings, schematically showing cross-sectional views of the manufacturing process along the I-I line at the X direction in FIG. 5A. FIGS. 7A to 7E are drawings, schematically showing cross-sectional views of the manufacturing process along the II-II line at the Y direction in FIG. 5A.

Figure 7A:
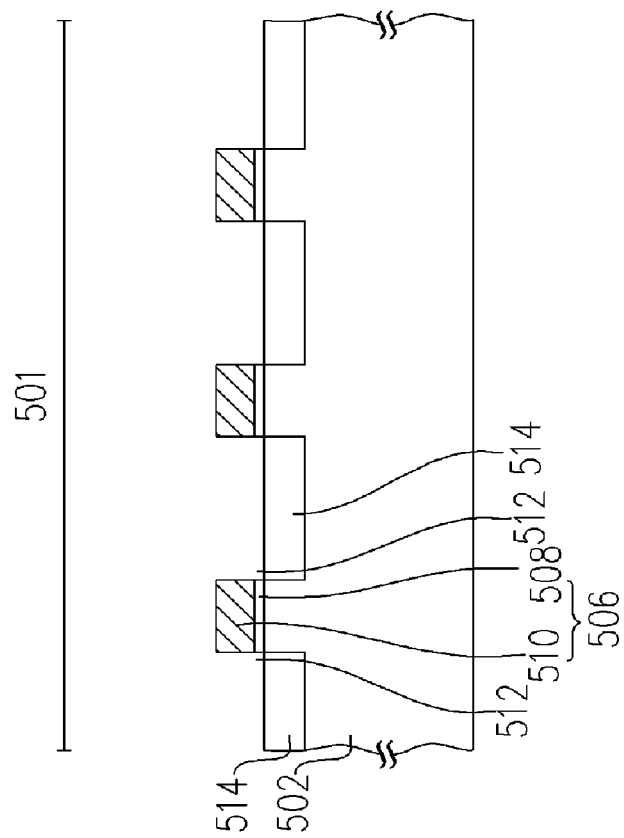
Figure 6A:
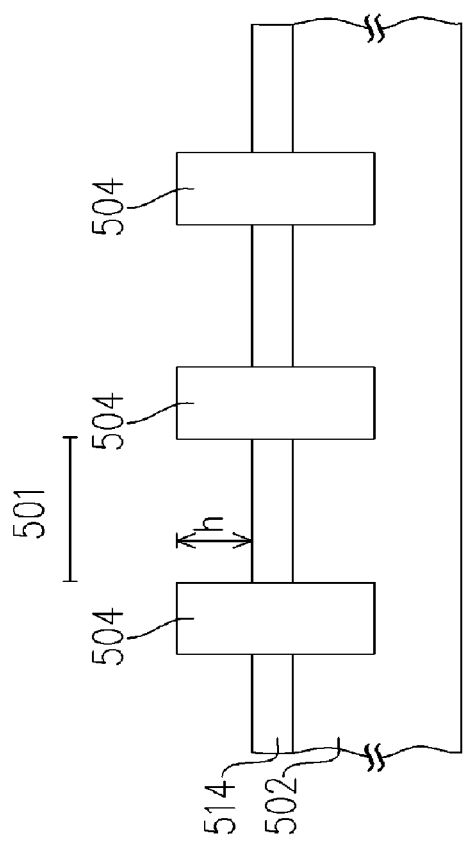

First, as shown in FIG. 5A, FIG. 6A and FIG. 7A, multiple isolation structures 504 are formed in the substrate 502 to define an active area 501. The tops of the isolation structures 504 keep a distance h from the surface of the substrate 502. The distance h in the embodiment of the present invention is, for example, at least 1000 angstroms. The manufacture method of the isolation structures 504 is described as follows.

FIGS. 8A to 8D are drawings, schematically showing cross-sectional views of the manufacturing process of the isolation structures along the I-I line at the X direction in FIG. 5A. First, as shown in FIG. 8A, a patterned under-layer 503 and a patterned mask layer 505 are formed over the substrate 502 and expose a portion of the substrate 502, wherein the total thickness of the patterned under-layer 503 and the patterned mask layer 505 is about greater than 1000 angstroms. Further, as shown in FIG. 8B, with the patterned under-layer 503 and the patterned mask layer 505 as the mask, a portion of the substrate 502 being exposed is removed. Therefore, multiple trenches 507 are formed in the substrate 502. Further, as shown in FIG. 8C, an isolation material layer 509 is formed over the substrate 502 to cover the patterned mask layer 505 and to fully fill the trenches 507. Furthermore, as shown in FIG. 8D, a portion of the isolation material layer 509, the patterned mask layer 505 and the patterned under-layer 503 outside the trenches 507 is removed, therefore the isolation structures 504 are formed.

Further, as shown in FIG. 5A, FIG. 6A and FIG. 7A continuously, after the isolation structures 504 are formed, multiple gate structures 506 are formed over the substrate 502. The method of forming the gate structures 506 includes, for example, first forming a blanket layer of the gate dielectric material layer over the substrate 502, which is not appeared in the figures, wherein the material is, for example, silicon oxide. The forming method is, for example, the thermal oxidation process. Further, a blanket layer of the gate material layer is formed over the gate dielectric material layer, which is not appeared in the Figures. Furthermore, the gate material layer and the gate dielectric material layer are patterned to form the gate structures 506, which include the gate dielectric layer 508 and the gate layer 510.

Further, multiple doped areas 514 are formed in the substrate 502 at the sides of each of the gate structures 506. The method of forming the doped areas 514 is, for example, implanting the dopants into the substrate 502 by an ion implantation manner or other manners.

Figures 6B, 7B:
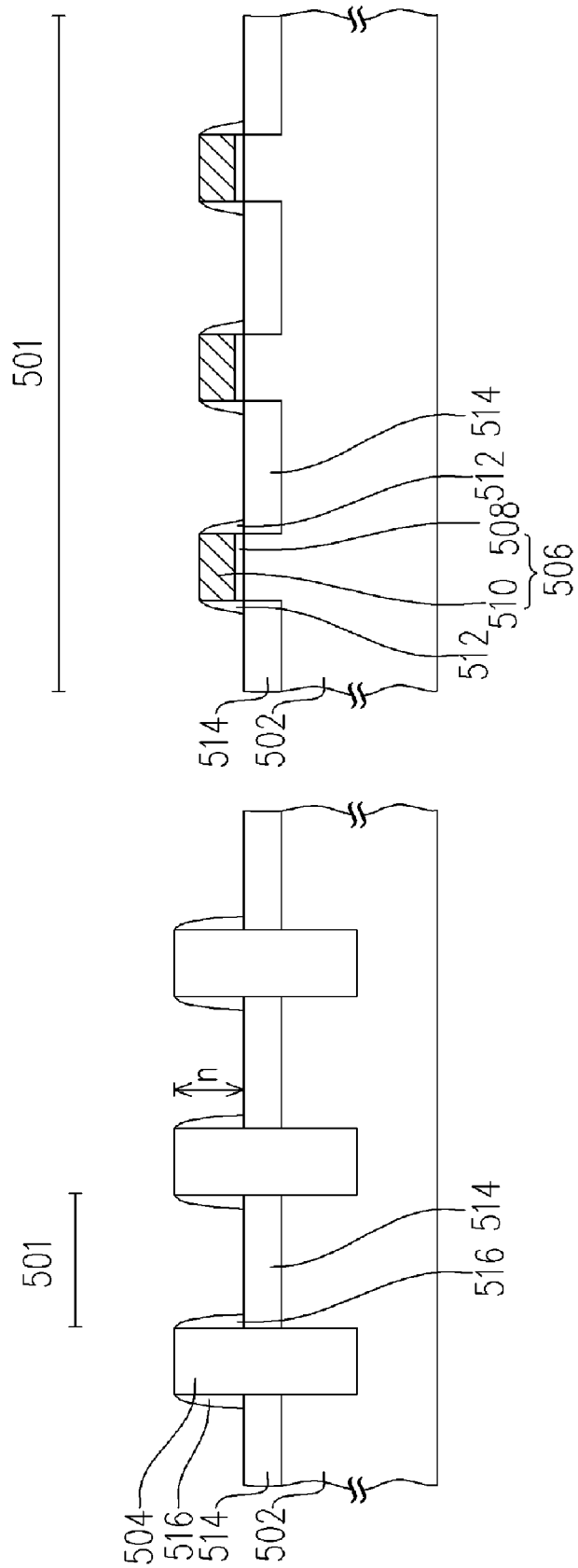

Further, as shown in FIG. 5A, FIG. 6B and FIG. 7B, multiple spacers 512 are formed on the sidewall of each of the gate structures 506, and it is preferred to form multiple spacers 516 on the sidewall of each of the isolation structure 504 at the same time. The material of the spacers 512 and 516 is, for example, silicon nitride or other material, which has a different etching selection from the isolation structures 504. The method of forming the spacers are, for example, depositing a spacer material layer (not shown) over the substrate 502, for covering the isolation structures 504, the gate structures 506 and the substrate 502. Further, an anisotropic etching process is performed to form the spacers 512 and 516.

Especially, because the height of the isolation structure 504 in the present invention is higher, when the foregoing anisotropic etching process is performed, a portion of the spacer material layer on the sidewall of the isolation structures 504 remains and therefore forms the spacers 516. Besides, the formed spacers 516 also serve a similar function of etching mask layer at a subsequent manufacturing process of contact openings. It should be noted that, although the spacers 512 and 516 are formed at the same time in the illustrated embodiment of the present invention, it is to be understood that the embodiment is presented by way of example and not by way of limitation. The spacers 516 can also be formed with different steps in other embodiments.

Further, as shown in FIG. 5A, FIG. 6C and FIG. 7C, a dielectric layer 518 is formed over the substrate 502 to cover the substrate 502 and the above mention of the gate structures 506, the isolation structures 504 and the spacers 512 and 516. The material of the dielectric layer 518 can be silicon oxide, such as silicon oxide of BPSG or TEOS.

Further, as shown in FIG. 5A, FIG. 6D and FIG. 7D, a self-aligned process is performed to form multiple contact openings 520 in the dielectric layer 518 between each of the two neighboring gate structures 506 for exposing the doped areas 514. The method of forming the contact openings 520 includes, for example, forming a patterned photoresist layer, which is not described in the Figures, with exposing a portion of the dielectric layer 518 at the place where is preserved to form the contact openings. Further with the patterned photoresist (not shown) layer as a mask, an etching process is performed on the dielectric layer 518. Furthermore, the patterned photoresist layer is removed to form the contact openings 520.

Figure 1:
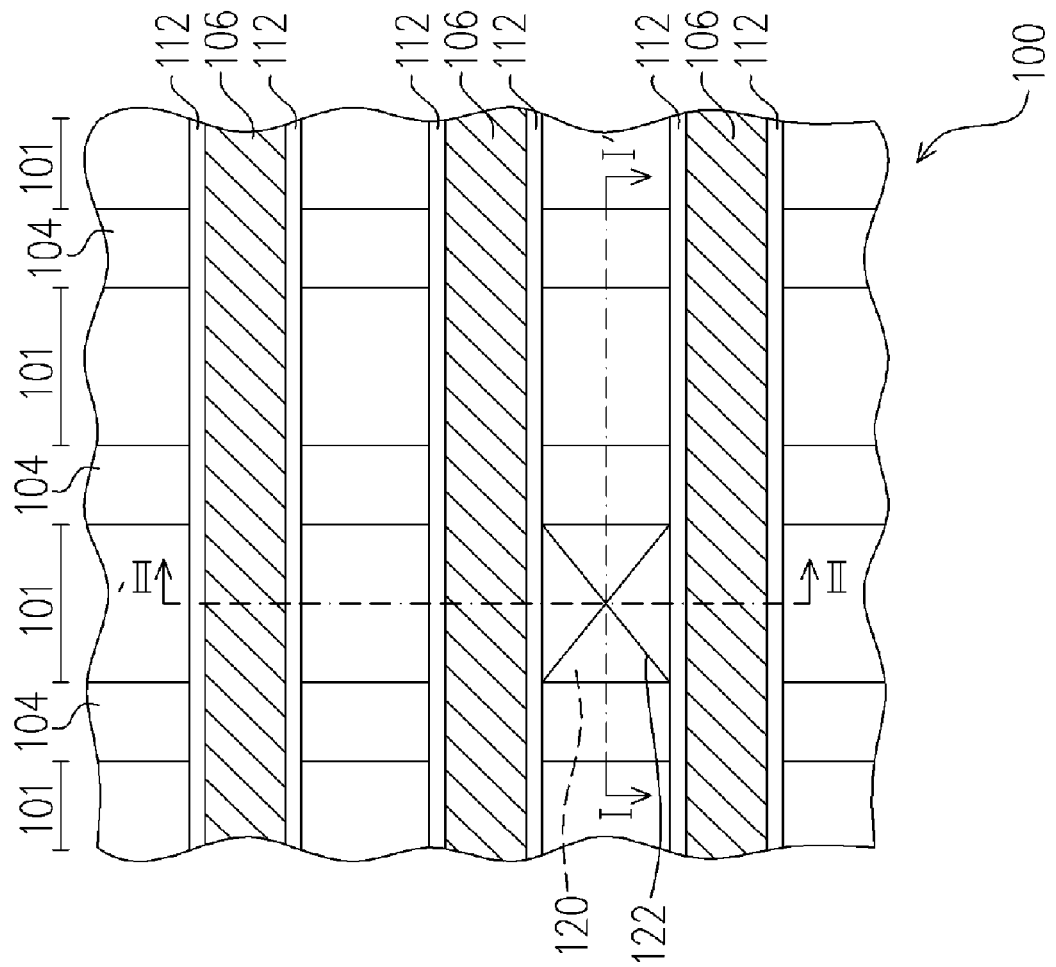
FIG. 1 is a drawing, schematically showing a top view of a conventional semiconductor device having self-aligned contacts.
Figures 2B, 3B:
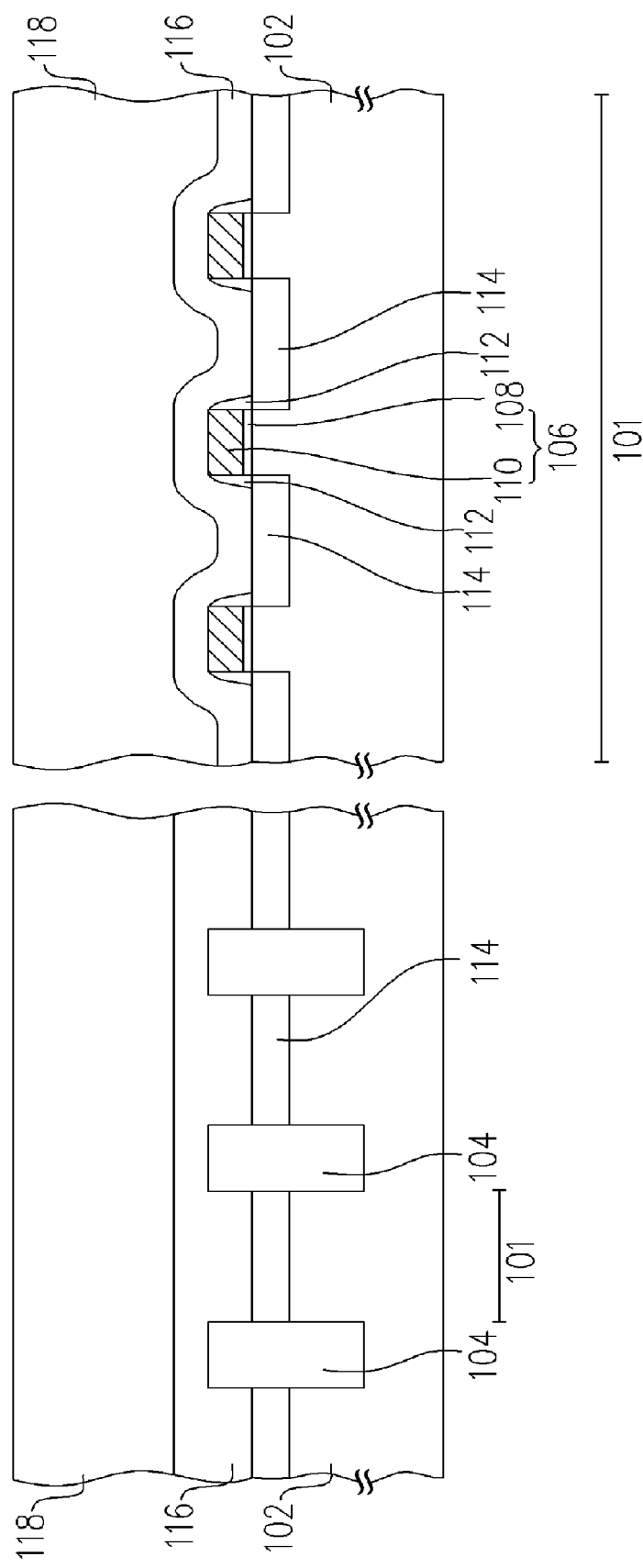
Figures 2C, 3C:
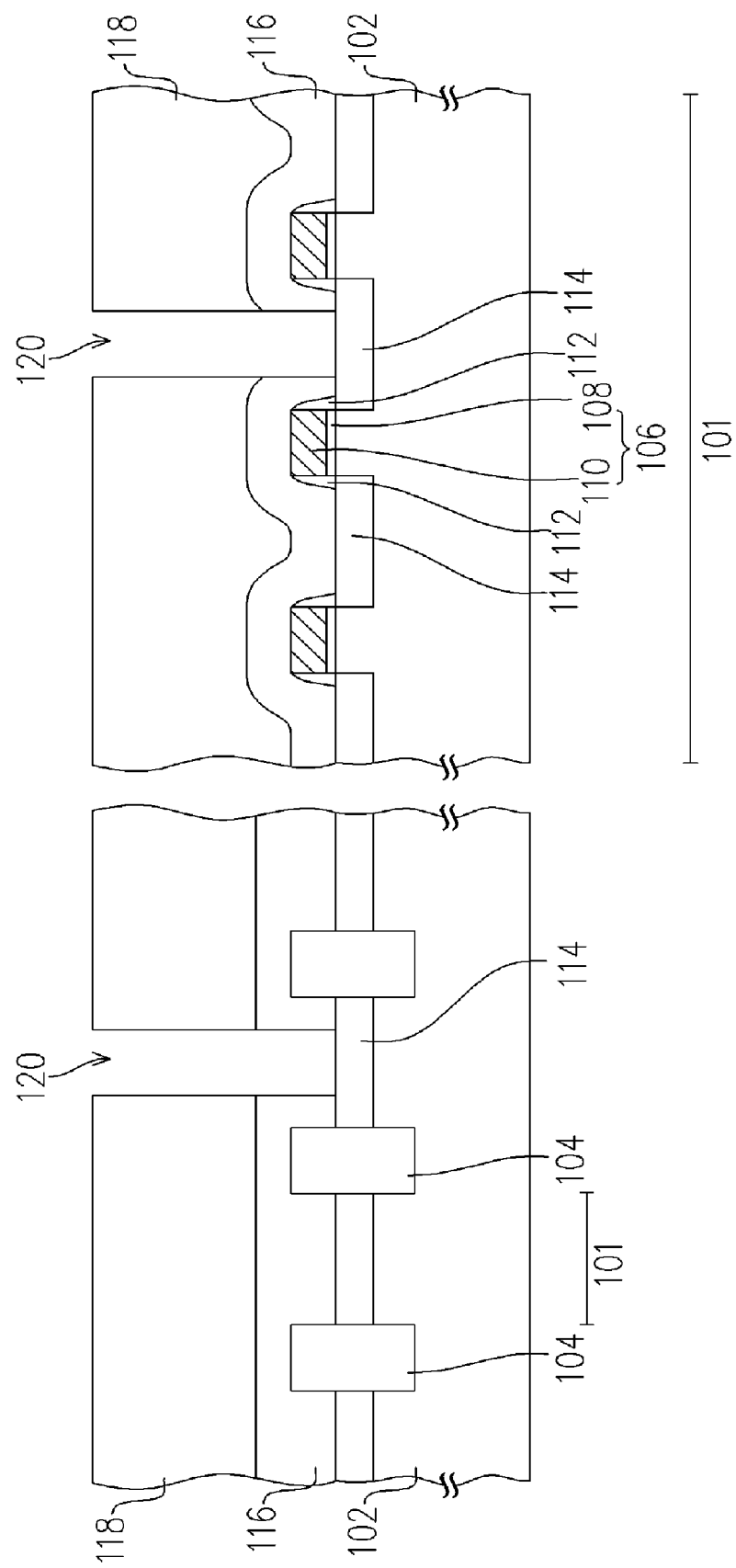
Figures 2D, 3D:
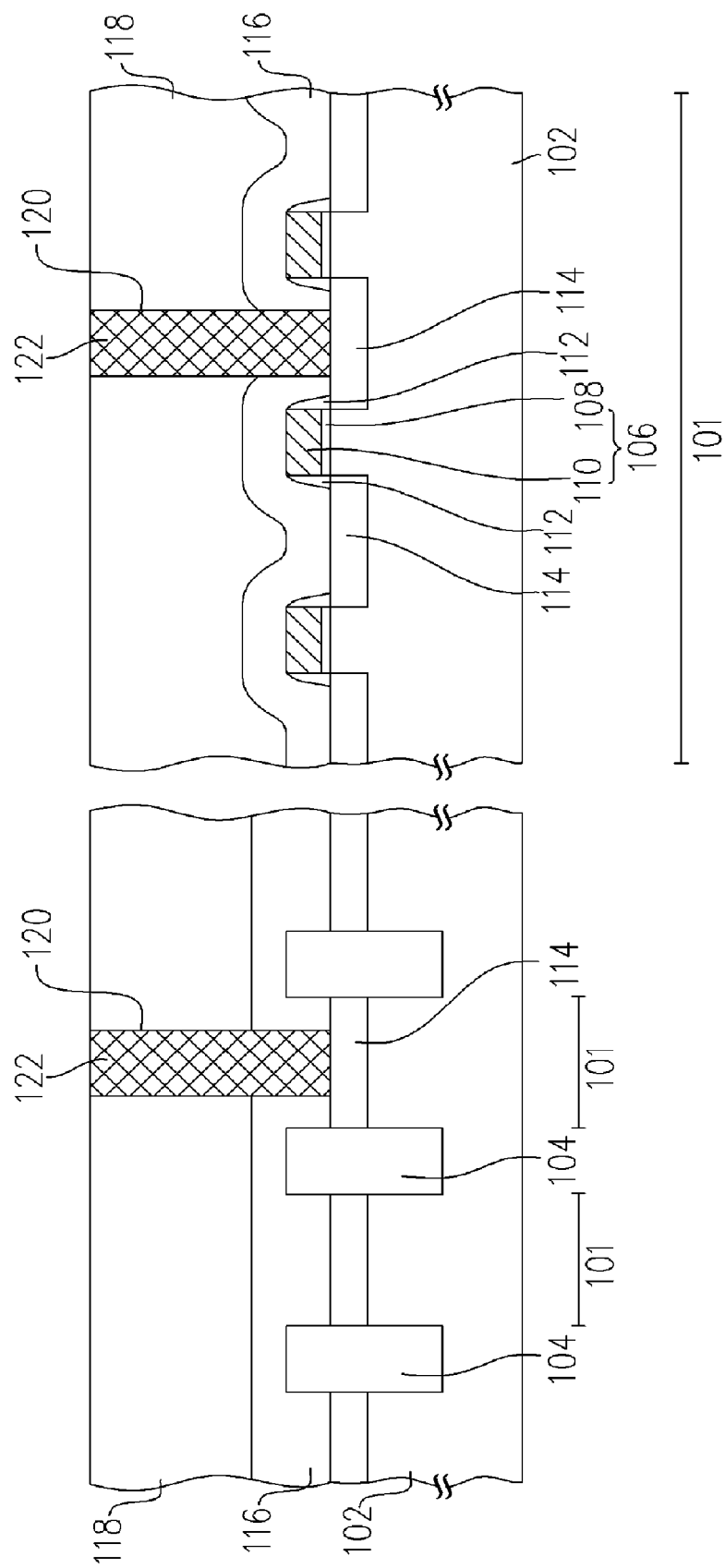

More particularly, during the process of forming the contact openings 520, because the spacers 516 and 512 are formed separately on the sidewalls of the isolation structures 504 and the gate structures 506, the spacers 516 and 512 also can also serve masking function. The misalignment can be effectively avoided, and then the damage to the isolation structures 504 and the gate structures 506 is further prevented. Further, because the spacers 516 serve the function of the etching mask layer, the silicon nitride layer 116, as shown in FIG. 2B can be replaced with forming the spacers 516. As a result, it is not necessary to preserve a large space in advance between the isolation structures, so that the device integration can be improved.

Further as shown in FIG. 5A, FIG. 6E and FIG. 7E, the conductive material is filled into the contact openings 520 for forming conductive plugs 522. The method of forming the plugs 522 includes, for example, first depositing the conductive material on the dielectric layer 518 to fill the contact openings 520. Further, a portion of the conductive material outside the contact openings 520 is removed by utilizing, for example, a chemical mechanical polishing (CMP) process or an etching back process.

In summary of the above mentioned in the present invention, since the spacers are formed on the sidewalls of the isolation structures and the gate structures, the misalignment can be effectively avoided in performing the self-aligned process. As a result, the damage to the isolation structures and the gate structures is further prevented. Besides, instead of the conventional silicon nitride as the etching mask layer, the spacers are formed on the sidewalls of the isolation structures in the present invention, so that the manufacturing process is simpler and the integration of the devices can increase.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A semiconductor device having self-aligned contacts, comprising:
   a substrate;
   a plurality of isolation structures, wherein a top of each of the isolation structures keeps a distance to above a top surface of the substrate, and the plurality of the isolation structures is composed of dielectric materials;
   a plurality of gate structures, disposed over the substrate;
   a plurality of doped areas, disposed in the substrate at each side of the gate structure,
   a dielectric layer, covering over the substrate, the isolation structures and the gate structures;
   a plurality of conductive plugs, disposed in the dielectric layer and electrically connected with the doped areas;
   a plurality of first spacers, disposed on a sidewall of each of the gate structures and between each of the conductive plugs and each of the gate structure; and
   a plurality of second spacers, disposed on an entire sidewall surface of each of the isolation structures and between each of the conductive plugs and each of the isolation structures, wherein a material of the second spacers has different etch selection from the isolation structures, wherein the conductive plugs are surrounded by the first spacers and the second spacers.

2. The semiconductor device having self-aligned contacts of claim 1, wherein the distance between the top of each of the isolation structures and the surface of the substrates is at least 1000 angstroms.

3. The semiconductor device having self-aligned contacts of claim 1, wherein a material of the first spacers comprises silicon nitride.

4. The semiconductor device having self-aligned contacts of claim 1, wherein a material of the second spacers comprises silicon nitride.

5. The semiconductor device having self-aligned contacts of claim 1, wherein a material of the isolation structures comprises silicon oxide.

6. The semiconductor device having self-aligned contacts of claim 5, wherein the material of the isolation structure comprises silicon oxide of BPSG (borophosphosilicate glass) or TEOS (tetra-ethyl-ortho-silicate).

* * * * *